(12) United States Patent
Kimura et al.

(10) Patent No.: US 10,827,654 B2
(45) Date of Patent: Nov. 3, 2020

(54) VEHICLE ELECTRIC POWER CONTROL COOLING DEVICE MOUNTING

(71) Applicant: Honda Motor Co., Ltd., Tokyo (JP)

(72) Inventors: Hideo Kimura, Saitama (JP); Yoshinaka Hirata, Saitama (JP)

(73) Assignee: Honda Motor Co., Ltd., Tokyo (JP)

(*) Notice: Subject to any disclaimer, the term of this patent is extended or adjusted under 35 U.S.C. 154(b) by 21 days.

(21) Appl. No.: 16/016,659

(22) Filed: Jun. 25, 2018

(65) Prior Publication Data

US 2019/0014693 A1    Jan. 10, 2019

(30) Foreign Application Priority Data

Jul. 6, 2017  (JP) .................................. 2017-132778

(51) Int. Cl.
*B60K 6/20*       (2007.10)
*H05K 7/20*       (2006.01)
(Continued)

(52) U.S. Cl.
CPC .......... *H05K 7/20872* (2013.01); *B60K 6/22* (2013.01); *H05K 7/02* (2013.01); *H05K 7/20927* (2013.01);
(Continued)

(58) Field of Classification Search
CPC .. H05K 7/20872; H05K 7/20927; H05K 7/02; H05K 7/20; H05K 7/20845;
(Continued)

(56) References Cited

U.S. PATENT DOCUMENTS 6,201,365 B1 * 3/2001 Hara ........................ B60K 6/26
                                                    318/558
6,907,947 B2 * 6/2005 Morita .................. B60L 3/0015
                                                    180/65.1
(Continued)

FOREIGN PATENT DOCUMENTS

CN      103052776      4/2013
JP      2004340029     12/2004
(Continued)

OTHER PUBLICATIONS

"Office Action of Japan Counterpart Application", dated Mar. 12, 2019, with English translation thereof, p. 1-p. 7.
(Continued)

*Primary Examiner* — James M Dolak
(74) *Attorney, Agent, or Firm* — JCIPRNET

(57) ABSTRACT

A cooling device which can arrange a cooling water tank in parallel near an electric power control device, and can more effectively utilize a space inside the engine room, and by which the miniaturization of the engine room is realized, and temperature increase of the wiring can be suppressed. The cooling device is a cooling device for cooling a device of a vehicle including an electric power control device to control an input-output voltage of the vehicle and a wiring connected to the electric power control device, and includes cooling water for cooling the device of the vehicle and a cooling water tank for accommodating the cooling water; the cooling water tank has a dented side surface wall along an external shape of the wiring, and has a shape which covers at least a portion of the wiring by closely disposing the wiring along the dented side surface wall.

2 Claims, 16 Drawing Sheets

(51) Int. Cl.
  *B60K 6/22* (2007.10)
  *H05K 7/02* (2006.01)
  *B60R 16/03* (2006.01)
  *B60K 6/54* (2007.10)

(52) U.S. Cl.
  CPC ................ *B60K 6/54* (2013.01); *B60R 16/03* (2013.01); *B60Y 2200/92* (2013.01); *B60Y 2306/05* (2013.01)

(58) Field of Classification Search
  CPC ... H05K 7/00; B60K 6/22; B60K 6/54; B60K 6/00; B60K 6/20; B60K 6/26; B60K 6/36; B60K 6/40; B60K 6/405; B60K 11/00; B60K 11/02; B60K 1/00; B60K 1/04; B60K 2001/003; B60K 2001/005; B60K 2001/006; B60R 16/03; B60R 16/02; B60R 16/00; B60R 16/08; B60R 16/0238; B60R 16/0239; B60R 16/0307; B60R 16/033
  See application file for complete search history.

(56) References Cited

U.S. PATENT DOCUMENTS

| | | | | |
|---|---|---|---|---|
| 7,210,304 B2 * | 5/2007 | Nagashima | ............ | F28D 15/00 62/259.2 |
| 7,876,563 B2 * | 1/2011 | Shiba | .................. | H01L 23/473 165/104.33 |
| 8,479,867 B2 * | 7/2013 | Fukazu | ................ | H02G 3/0481 180/291 |
| 9,016,415 B2 * | 4/2015 | Kobayashi | ............ | B60K 11/02 180/68.4 |
| 9,145,058 B2 * | 9/2015 | Suzuki | ..................... | B60K 1/00 |
| 9,255,741 B2 * | 2/2016 | Sharaf | ....................... | F28D 7/00 |
| 9,266,422 B2 * | 2/2016 | Narita | ..................... | F02B 77/13 |
| 9,402,336 B2 * | 7/2016 | Suzuki | ................... | B60L 50/51 |
| 9,739,035 B2 * | 8/2017 | Naito | ..................... | E02F 9/0858 |
| 9,789,758 B2 * | 10/2017 | Zhao | ..................... | B60H 1/00321 |
| 10,665,908 B2 * | 5/2020 | Krull | ................. | H01M 10/6567 |
| 10,675,962 B2 * | 6/2020 | Urabe | ...................... | B60K 1/02 |
| 10,676,054 B2 * | 6/2020 | Koll | .......................... | B60S 1/50 |
| 2012/0112537 A1 | 5/2012 | Fukazu et al. | | |
| 2016/0146093 A1 * | 5/2016 | Takahashi | ............... | F01P 11/029 165/104.32 |

FOREIGN PATENT DOCUMENTS

| | | |
|---|---|---|
| JP | 2007090945 | 4/2007 |
| JP | 2012030604 | 2/2012 |
| JP | 2014117982 | 6/2014 |

OTHER PUBLICATIONS

"Office Action of Japan Counterpart Application", dated Sep. 10, 2019, with English translation thereof, p. 1-p. 4.

* cited by examiner

VEHICLE ELECTRIC POWER CONTROL COOLING DEVICE MOUNTING

CROSS-REFERENCE TO RELATED APPLICATION

This application claims the priority of Japan patent application serial no. 2017-132778, filed on Jul. 6, 2017. The entirety of the above-mentioned patent application is hereby incorporated by reference herein and made a part of this specification.

BACKGROUND

1. Technical Field

The disclosure relates to a cooling device which cools a device of a vehicle that includes an electric power control device to control an input-output voltage of the vehicle and a wiring connected to the electric power control device.

2. Description of Related Art

In a hybrid vehicle, an electric motor, an electric power control device which supplies electric power to the electric motor, and a wiring connecting the electric motor and the electric power control device are mounted inside an engine room of the vehicle. Similar to auxiliary machines of the vehicle, these parts are cooled by the cooling device inside the engine room in order to suppress a temperature increase. The cooling device has a cooling water tank for storing cooling water.

In recent years, as electric power control elements, electric wirings, and pipes inside the engine room of the vehicle increase, a mounting region of the cooling water tank is limited. For this reason, when the cooling water tank is to be mounted, it is necessary to miniaturize the engine room and effectively utilize space inside the engine room. Therefore, in the past, a technology is proposed which disposes the cooling water tank on the electric power control device to effectively utilize the space inside the engine room (for example, see patent literature 1: Japanese Laid-open No. 2007-90945).

However, in a method which disposes the cooling water tank on the electric power control device as described in patent literature 1, an engine hood of the vehicle cannot be lowered. Besides, in a case of the vehicle with a low engine hood, it is difficult to dispose the cooling water tank.

In order to keep the engine hood of the vehicle low, the cooling water tank is ideally arranged in parallel near the electric power control device. However, because a wiring with a thick external diameter to cope with a temperature rising along with electric power consumption is connected to the electric power control device, the wiring becomes overly thick, and the cooling water tank cannot be arranged in parallel near the electric power control device, making it difficult to miniaturize the engine room.

Besides, the cooling device which has a conventional configuration of the cooling water tank cannot suppress the temperature increase of the wiring connected to the electric power control device, and improvement is expected.

SUMMARY (1) The cooling device of one or some exemplary embodiments of the invention is a cooling device (for example, a cooling device 1 described below) which cools a device of a vehicle that includes an electric power control device (for example, an electric power control device 2 described below) controlling an input-output voltage of the vehicle and a wiring (for example, a wiring 3 described below) being connected to the electric power control device. The cooling device includes: cooling water, which cools the device of the vehicle; and a cooling water tank (for example, a cooling water tank 4 described below), which accommodates the cooling water; wherein the cooling water tank has a dented side surface wall (for example, a dented side surface wall 46 described below) along an external shape of the wiring, and the wiring is covered by closely disposing the wiring along the dented side surface wall.

DESCRIPTION OF THE EMBODIMENTS

Figure 1:
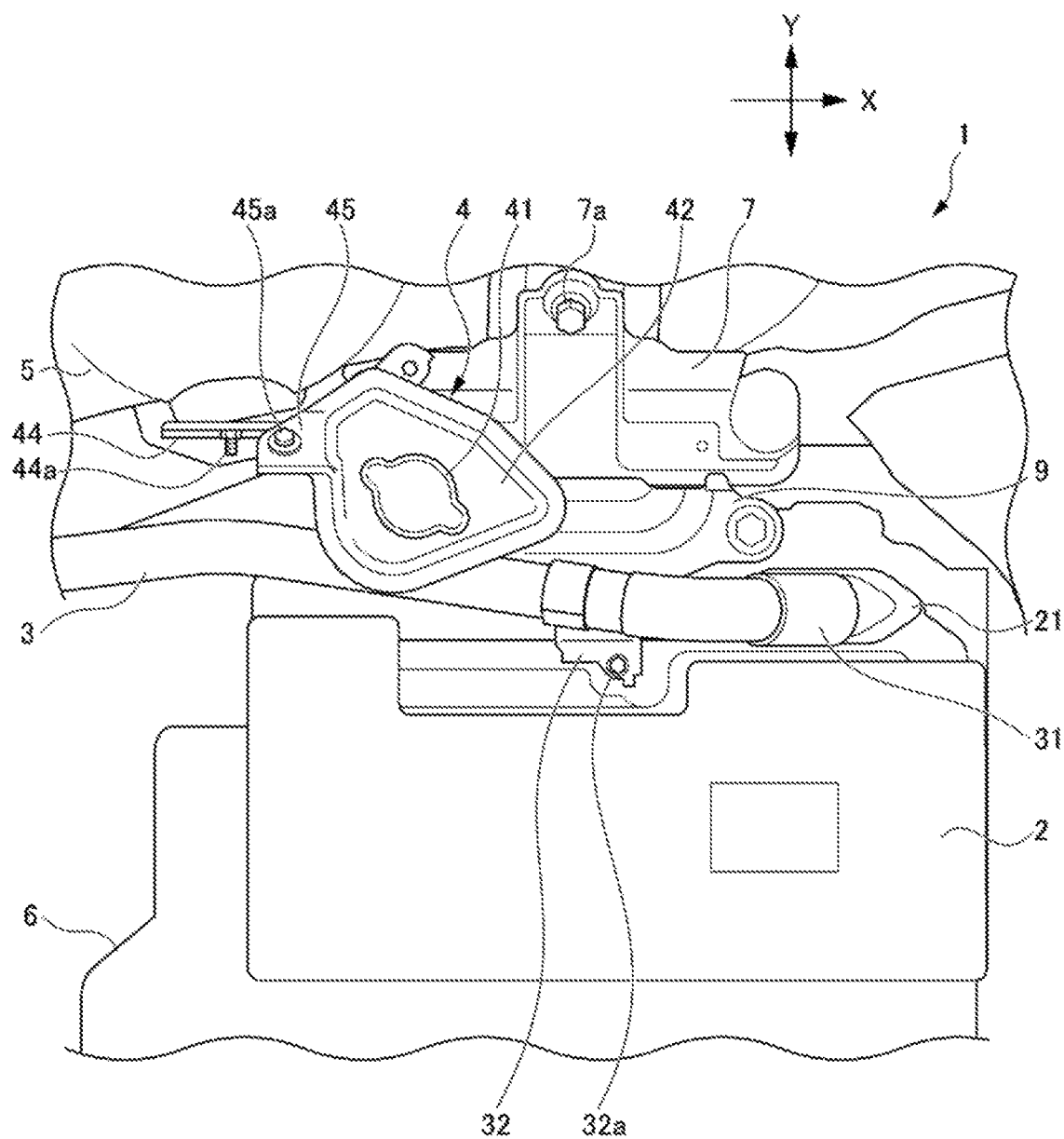
FIG. 1 is a plan view showing a structure of a cooling device of an embodiment of the invention.

The embodiments of the invention provide a cooling device in which the cooling water tank can be arranged in parallel near the electric power control device, and space inside the engine room can be more effectively utilized, thereby realizing the miniaturization of the engine room and suppressing the temperature increase of the wiring.

According to the cooling device described in the above-mentioned (1), the wiring does not become a trouble, and the cooling water tank can be arranged in parallel near the electric power control device inside the engine room of the vehicle. In particular, only a narrow space exists between the electric power control device and an internal wall of a vehicle body. Even if the wiring is disposed in this space, the space is still more effectively utilized, and the cooling water tank can be arranged in parallel near the electric power control device. For this reason, the engine room can be miniaturized.

In addition, by being configured close to the wiring and covering the wiring, the cooling water tank can make the wiring temperature which increases along with the electric power consumption close to the temperature of the cooling water tank. For this reason, the cooling water tank can suppress excessive temperature increase of the wiring.

(2) In the cooling device described in (1), during the running of the vehicle, any one or two of the temperature of the cooling water and the temperature of the cooling water tank is maintained lower than the temperature of the wiring.

According to the cooling device described in the above-mentioned (2), the cooling water tank can actively suppress the temperature increase of the wiring. As a result, the external diameter of the wiring can be thinner than before, and the engine room can be further miniaturized.

(3) In the cooling device described in (1) or (2), the wiring can swing during the running of the vehicle, the cooling water tank and the wiring are separated with an interval below a predetermined interval, and the predetermined interval is larger than a swinging distance of the wiring during the running of the vehicle, and a distance corresponding to an attachment deviation of the wiring with respect to the electric power control device.

According to the cooling device described in the above-mentioned (3), the cooling water tank does not contact or interfere with the wiring during the rest of the vehicle or the swinging wiring during the running of the vehicle. For this reason, abrasion or damage of the wiring and the cooling water tank caused by contact or interference can be prevented. Besides, the cooling water tank is disposed so as to overlap in a projected area of the swinging part of the wiring. Therefore the cooling device can be miniaturized.

(4) In the cooling device described in any one of (1)-(3), the cooling water tank is fixed to the vehicle body by a first fixing part (for example, a third bracket 44 described below) in at least one position, and the wiring is fixed to the electric power control device by a second fixing part (for example, a first bracket 32 described below) in at least one position.

According to the cooling device described in the above-mentioned (4), the wiring fixed to the electric power control device swings when the vehicle runs, while the cooling water tank fixed to the vehicle body in at least one position is prevented from swinging when the vehicle runs. For this reason, abrasion or damage during the contact and interference of the wiring and the cooling water tank becomes serious. Therefore, by separating the wiring and the cooling water tank with an interval below the predetermined interval as mentioned above, the abrasion or damage of the wiring and the cooling water tank caused by the contact or interference can be more effectively prevented.

(5) In the cooling device described in (1)-(4), the wiring may be fixed to the cooling water tank by a third fixing part in at least one position.

According to the cooling device described in the above-mentioned (5), the swinging of the wiring can be suppressed. Besides, in this case, the swinging degree of the wiring becomes low, so that the separated distance of the wiring and the cooling water tank can be further shortened. For this reason, the temperature increase of the wiring can be further suppressed by the cooling water or the cooling water tank 4, and the engine room can be further miniaturized.

(6) In the cooling device described in (5), the third fixing part is a portion of the cooling water tank.

According to the cooling device described in the above-mentioned (6), it is unnecessary to form the third fixing part for the cooling water tank using an individual component such as a bolt or a bracket. Therefore not only can the structure of the cooling device be further simplified, but the separating distance of the wiring and the cooling water tank can also be further shortened. Accordingly, the temperature increase of the wiring can be further suppressed by the cooling water or the cooling water tank, and the engine room can be further miniaturized.

(7) In the cooling device described in any one of (1)-(6), the vehicle includes an accommodation chamber which accommodates the electric power control device, the wiring and the cooling water tank. The accommodation chamber includes: a driving speed-change device (for example, a transmission 6 described below) of the vehicle; and a driving speed-change device fixing component (for example, a transmission mount holder 7 and a transmission mount rubber 9 described below), which fixes the driving speed-change device to the vehicle; and the cooling water tank is fixed to the driving speed-change device or the driving speed-change device fixing component by a fourth fixing part (for example, a fourth bracket 8 and a rubber mount 82 described below) in at least one position.

According to the cooling device described in the above-mentioned (7), it is unnecessary to use a long fixing component to fix the cooling water tank, and the cooling water tank is fixed inside the engine room without enlarging the engine room. For this reason, the space for disposing the cooling water tank is easily ensured, and miniaturizing the engine room can be further improved.

According to the embodiments of the invention, the cooling device is provided in which the cooling water tank can be arranged in parallel near the electric power control device, and the space inside the engine room can be more effectively utilized, thereby realizing the miniaturization of the engine room and suppressing the temperature increase of the wiring.

In the following text, embodiments of the invention are described with reference to the drawings.

Figure 2:
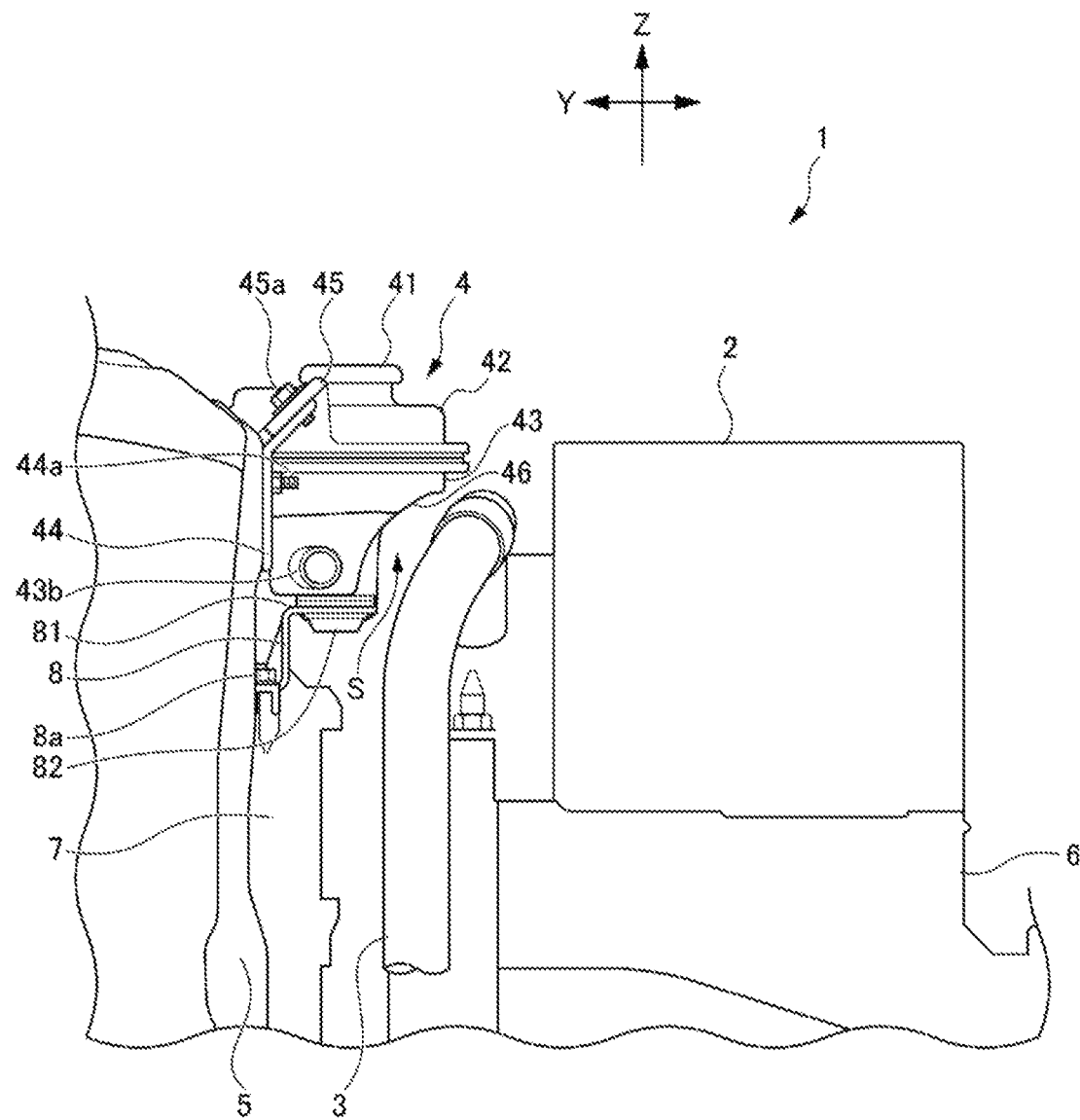
FIG. 2 is a side view obtained by observing the structure of the cooling device shown in FIG. 1 from a rear side of a vehicle.
Figure 3:
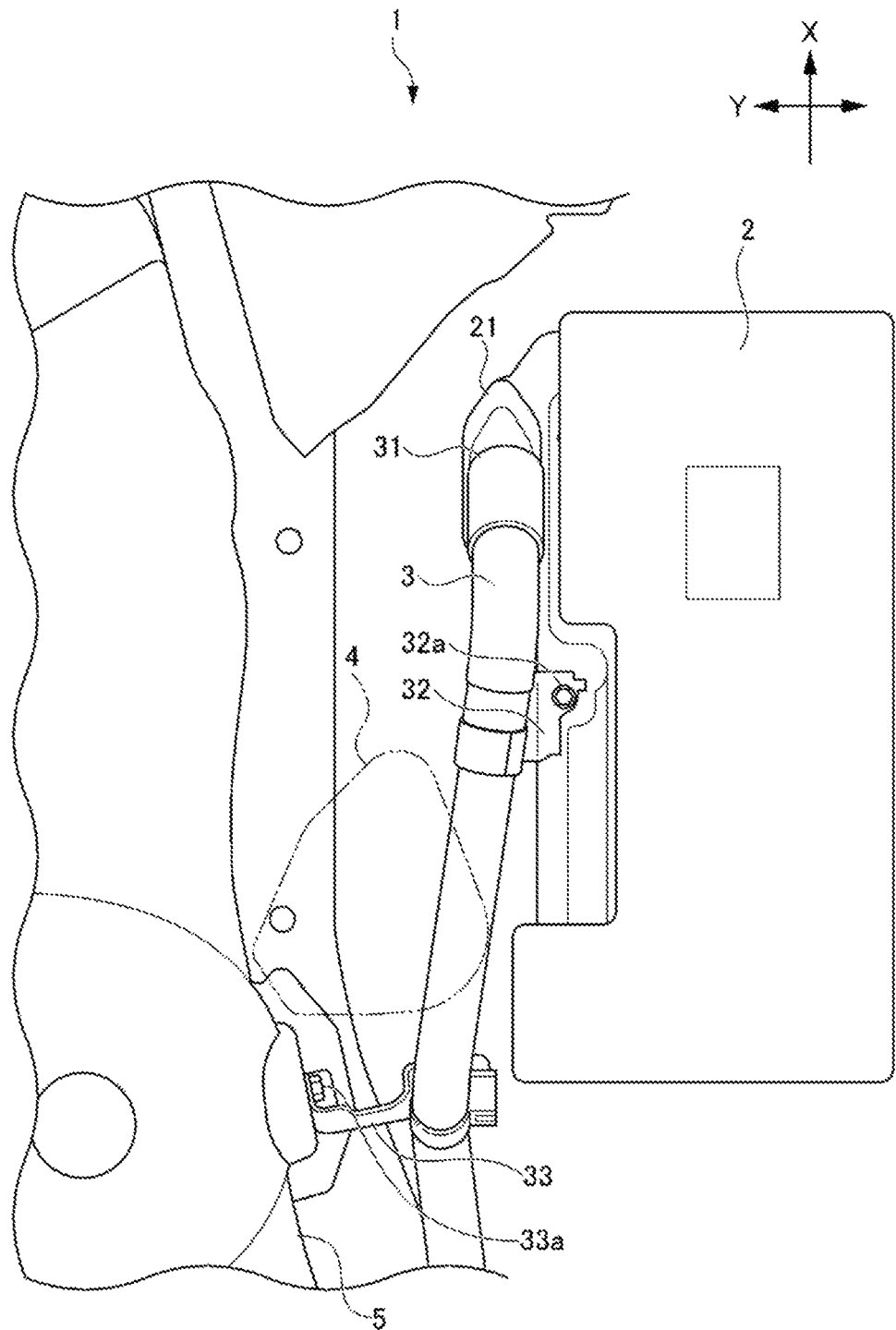
FIG. 3 is a plan view illustrating the structure of an electric power control device and a wiring in the cooling device shown in FIG. 1.
Figure 4:
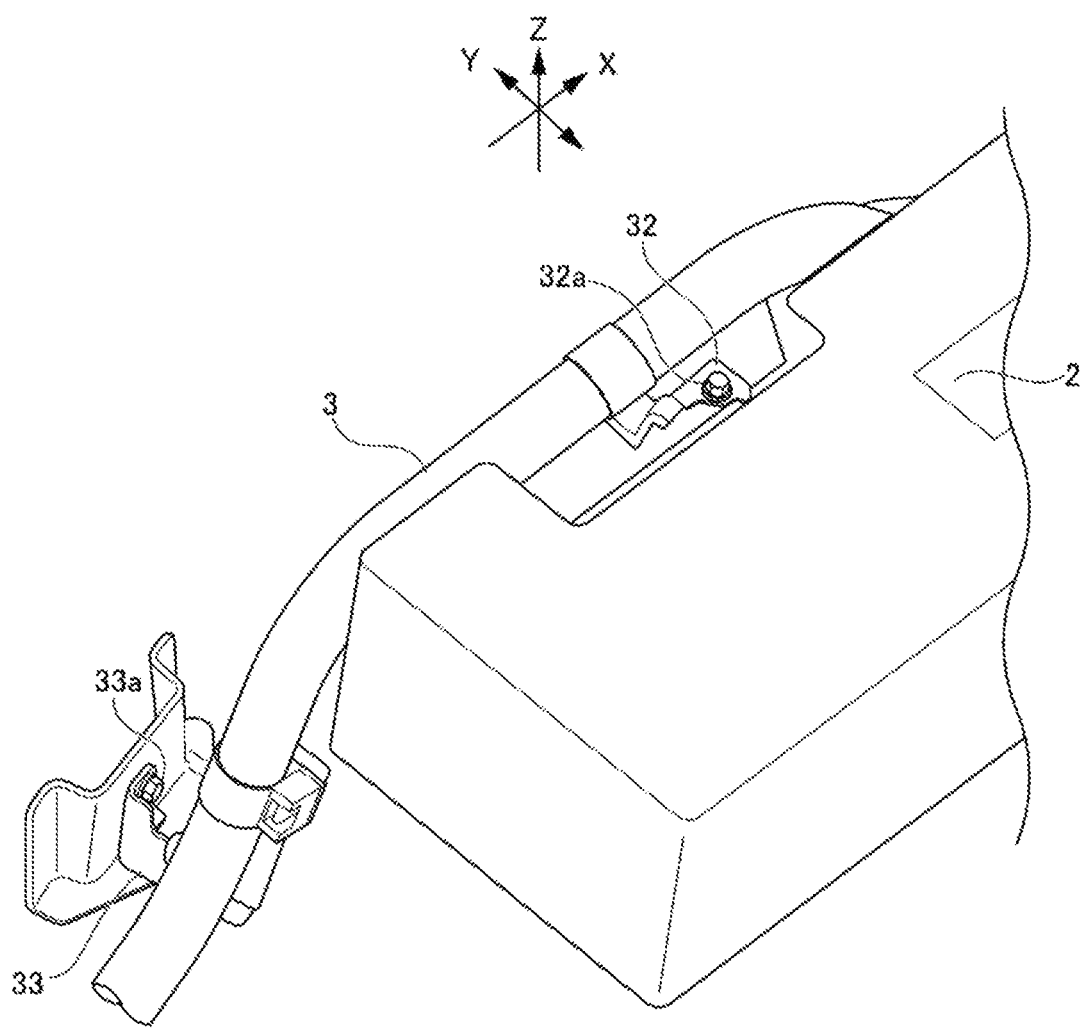
FIG. 4 is a perspective view illustrating the structure of the electric power control device and the wiring in the cooling device of an embodiment of the invention.

FIG. 1 is a plan view showing a structure of a cooling device of an embodiment of the invention. FIG. 2 is a side view obtained by observing the structure of the cooling device shown in FIG. 1 from a rear side of a vehicle. FIG. 3 is a plan view illustrating the structure of an electric power control device and a wiring in the cooling device shown in FIG. 1. FIG. 4 is a perspective view illustrating the structure of the electric power control device and the wiring in the cooling device of an embodiment of the invention.

The vehicle shown in this embodiment is a hybrid vehicle which includes an internal-combustion engine, and an electric motor that assists power generated by the internal-combustion engine. In the drawings below, both the internal-combustion engine and the electric motor are omitted.

Besides, in the drawing, an X direction stands for the front of the vehicle, a Y direction stands for a width direction of the vehicle, and a Z direction stands for the upside of the vehicle.

A cooling device 1 of the present embodiment includes cooling water for cooling a vehicle device having an electric power control device (PCU; power control unit) 2 and a wiring 3, and a cooling water tank 4 for accommodating the cooling water. The cooling device 1 is disposed in an engine room of the vehicle. The engine room is the accommodation chamber in the present embodiment.

The electric power control device 2 is a device controlling an input-output voltage of the vehicle, and as shown in FIG. 1 and FIG. 3, includes a substantially rectangular long box in the front-back direction of the vehicle in a plan view. The electric power control device 2 is disposed so as to approach a vehicle body internal wall 5 on one side (the left side in the engine room in this embodiment) in the engine room, and is fixed to an upper part of a driving speed-change device 6 (referred to as transmission 6 hereinafter) mounted in the engine room. The electric power control device 2 has an input-output terminal 21 connecting the wiring 3 on the vehicle body internal wall 5 side and a lateral part closer to the front of the vehicle.

The wiring 3 supplies electric power from a battery (not shown) to the electric power control device 2, and supplies the electric power obtained in the form of regenerative energy of the vehicle from the electric power control device 2 to the battery. The wiring 3 has an external diameter thicker than a common wiring in order to cope with the temperature increasing along with the electric power consumption. One end of the wiring 3 has a connecting terminal 31. The connecting terminal 31 is connected to the input-output terminal 21 of the electric power control device 2. The other end of the wiring 3 extends along the electric power control device 2 from the input-output terminal 21 so as to bend toward the rear and lower side of the vehicle, and is connected to the battery. As a result, the wiring 3 is disposed between the electric powercontrol device 2 and the vehicle body internal wall 5.

As shown in FIG. 3 and FIG. 4, the wiring 3 has a first bracket 32 for attaching the electric power control device 2 to the vicinity of the connecting terminal 31. Using the first bracket 32, the wiring 3 is fixed to the electric power control device 2 by a bolt 32a. The electric power control device 2 fixed to the transmission 6 swings due to the vibration of the transmission 6 when the vehicle runs. Because the wiring 3 is fixed to the electric power control device 2, the wiring 3 swings along with the swinging of the electric power control device 2 when the vehicle runs. For this reason, the electric power control device 2 does not interfere with the wiring 3 and generate a noise.

The first bracket 32 of the wiring 3 is an example of a second fixing part in the present embodiment. The second fixing part may be in at least one position.

The wiring 3 has a second bracket 33 for the attachment to the vehicle body on a side which is farther from the connecting terminal 31 than the first bracket 32, and on a position where the wiring 3 extending backward from the input-output terminal 21 heads downward. The second bracket 33 of the wiring 3 is disposed to a place lower than the first bracket 32. Using the second bracket 33, the wiring 3 is fixed to the vehicle body internal wall 5 by a bolt 33a.

The cooling water tank 4 is disposed between the electric power control device 2 and the vehicle body internal wall 5. More specifically, as shown in FIG. 1 and FIG. 3, the cooling water tank 4 is disposed between the electric power control device 2 and the vehicle body internal wall 5, and is disposed slightly closer to the rear side of the vehicle than the first bracket 32 of the wiring 3.

Figure 5:
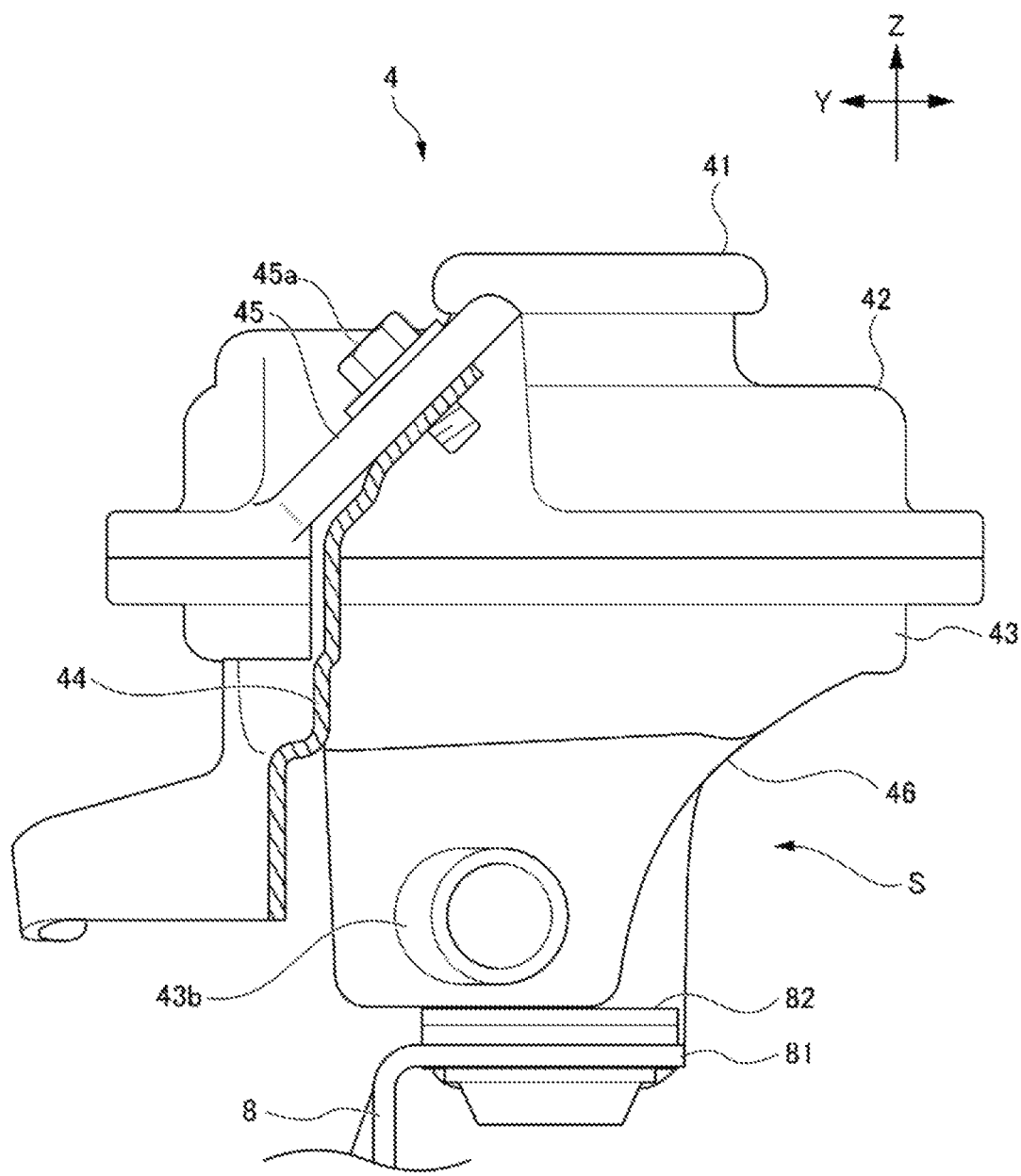
FIG. 5 is a diagram obtained by observing a cooling water tank from the rear side of the vehicle.
Figure 6:
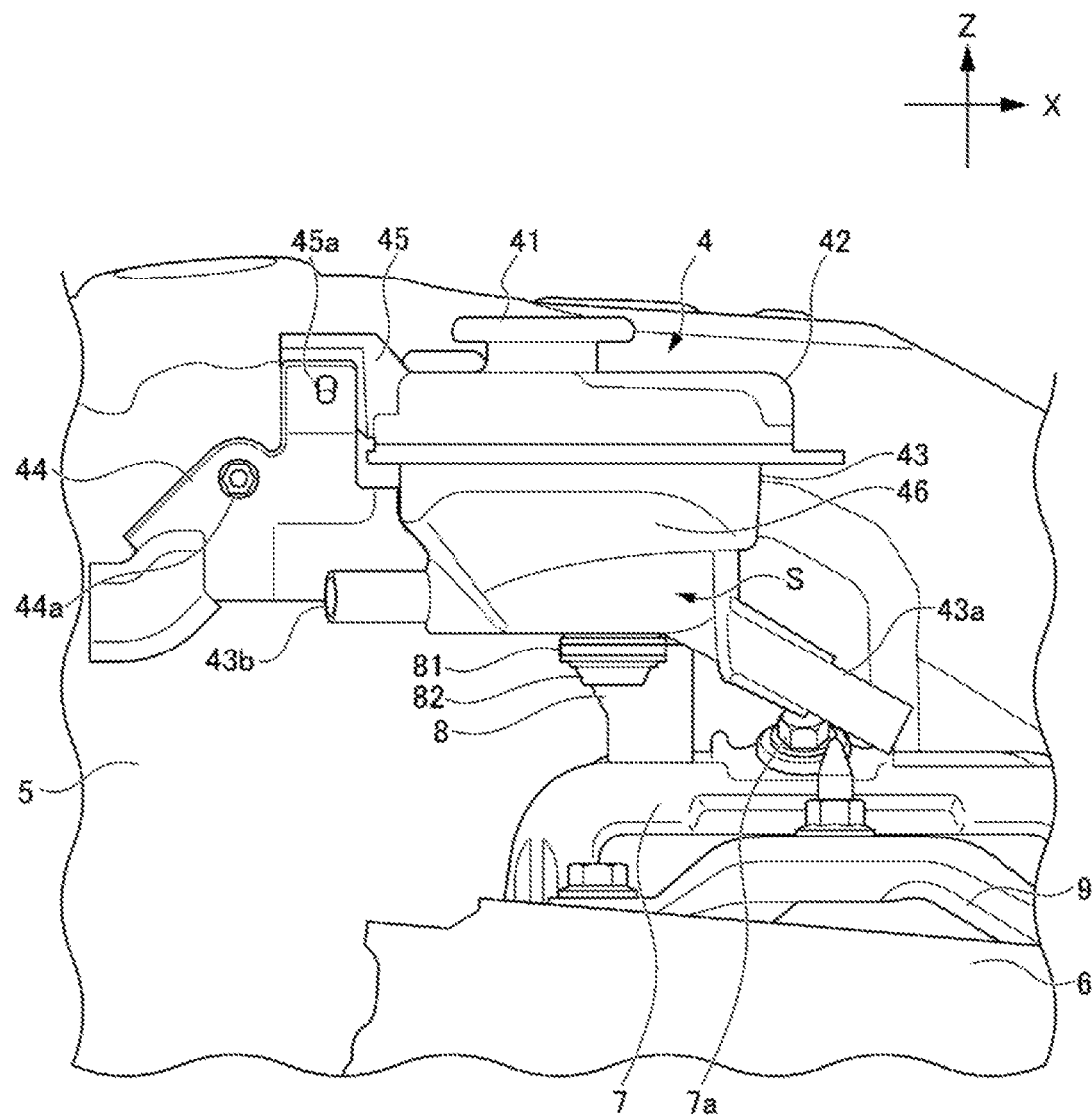
FIG. 6 is a diagram obtained by observing the cooling water tank from the electric power control device side.
Figure 7:
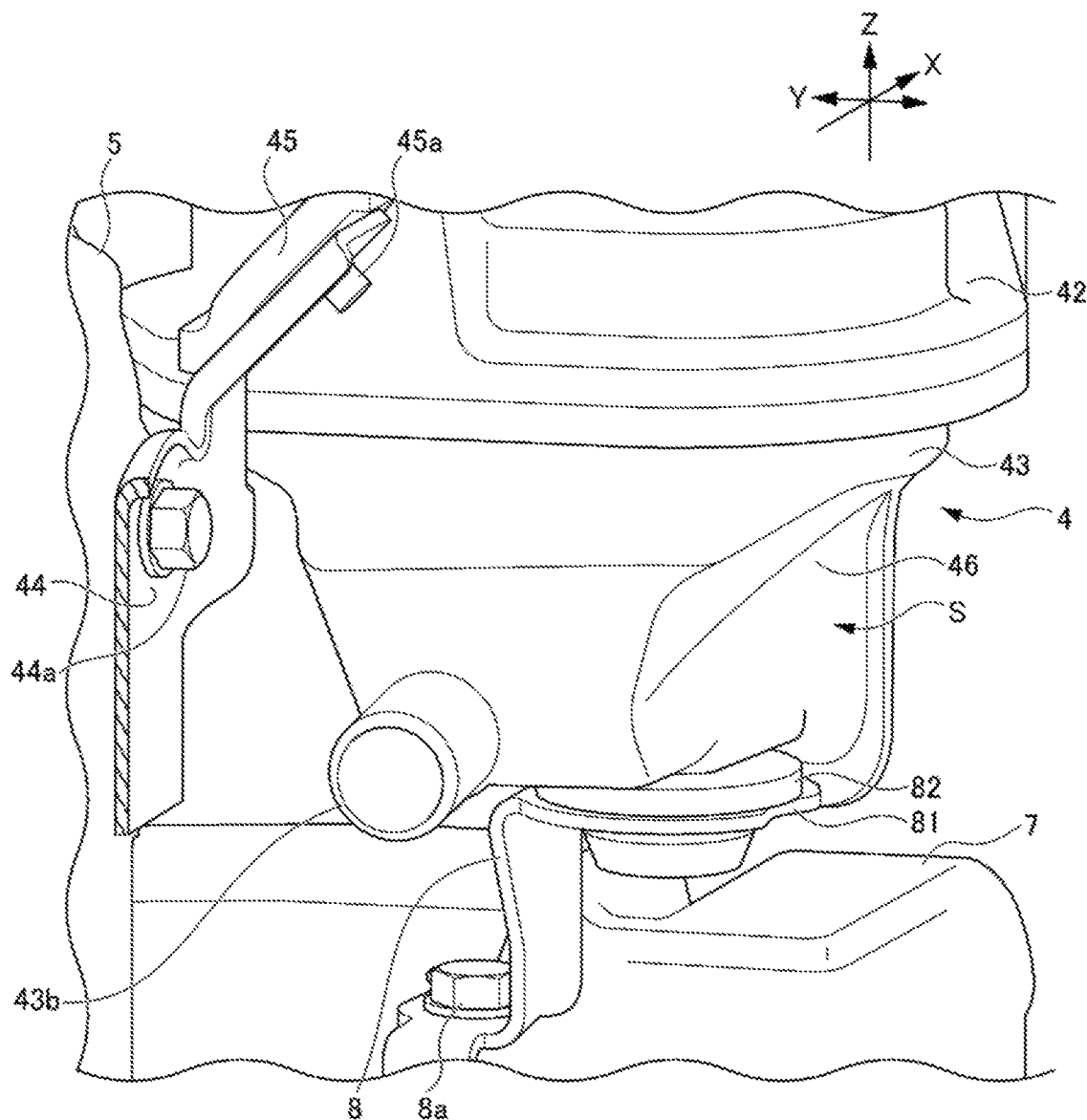
FIG. 7 is a diagram illustrating the lower structure of the cooling water tank.

The structure of the cooling water tank 4 is described in more detail with reference to FIG. 5 to FIG. 7. FIG. 5 is a diagram obtained by observing the cooling water tank 4 from the rear side of the vehicle. FIG. 6 is a diagram obtained by observing the cooling water tank 4 from the electric power control device 2 side. FIG. 7 is a diagram illustrating a lower structure of the cooling water tank 4.

The cooling water tank 4 has a cover 42, on which a lid 41 filling an injection opening of the cooling water is arranged, in an upper part of the tank, and has a storage part 43, where the cooling water for cooling various devices of the vehicle is accommodated, on a lower part of the tank. Symbols 43a and 43b in the drawing are circulation openings for the circulation of the cooling water. A pipe for circulating the cooling water is connected to the circulation openings 43a and 43b, but the illustration of the pipe is omitted to simplify the description.

The cover 42 of the cooling water tank 4 has a third bracket 44 for the attachment to the vehicle body. An upper end of the third bracket 44 is fixed by a bolt 45a to a sloping bracket 45 overhanging from the cover 42 toward the back of the vehicle. The sloping bracket 45 slopes downward at an angle of about 45° toward the vehicle body internal wall 5. The third bracket 44 is attached so as to hang from the sloping bracket 45 along the vehicle body internal wall 5. Using the third bracket 44, the cooling water tank 4 is fixed to the vehicle body internal wall 5 by a bolt 44a.

The third bracket 44 of cooling water tank 4 is an example of the first fixing part in the present embodiment. The first fixing part may be in at least one position.

The cooling water tank 4 also has a fixing part on a lower surface of the storage part 43. That is, the storage part 43 of the cooling water tank 4 is fixed to the fourth bracket 8 which is attached to an upper surface of the transmission mount holder 7 by a bolt 8a. As shown in FIG. 1 and FIG. 6, the transmission mount holder 7 is fixed to the vehicle body internal wall 5 inside the engine room by a bolt 7a. The transmission 6 is fixed to the transmission mount holder 7 via the transmission mount rubber 9. Accordingly, the transmission 6 is fixed to the vehicle via the transmission mount holder 7 and the transmission mount rubber 9. The transmission mount holder 7 and the transmission mount rubber 9 are an example of the driving speed-change device fixing component of the present embodiment for fixing the transmission (driving speed-change device) 6 to the vehicle.

An upper end of the fourth bracket 8 has a horizontal part 81 which has an opening part and is formed to bend horizontally. The horizontal part 81 of the fourth bracket 8 has a ring-shaped rubber mount 82. The rubber mount 82 is embedded into the opening part of the horizontal part 81 so as to clamp the horizontal part 81 from the upper side and lower side. The cooling water tank 4 has an attachment protruding part (not shown) which protrudes downward from a lower surface of the storage part 43. By inserting the attachment protruding part into the ring-shaped rubber mount 82 from above, a lower part of the cooling water tank 4 is fixed using the elasticity of the rubber mount 82. That is, the cooling water tank 4 is supported between the electric power control device 2 and the vehicle body internal wall 5 inside the engine room by fixing parts in two positions which are the fixing part of the third bracket 44 to the vehicle body internal wall 5 and the fixing part of the fourth bracket 8 and the rubber mount 82 to the transmission mount holder 7.

The fourth bracket 8 and the rubber mount 82 are an example of the fourth fixing part in the present embodiment. The fourth fixing part may be in at least one position.

The storage part 43 of the cooling water tank 4 supported inside the engine room is disposed on the lateral side of the wiring 3. Here, among the side surface walls which form the storage part 43 of the cooling water tank 4, only a side surface wall 46 opposing the wiring 3 is different from other side surface walls, and is formed to a dented shaped along the external shape of the wiring 3. Specifically, as shown in FIG. 2, FIG. 5 and FIG. 7, among the side surface walls which form the storage part 43 of the cooling water tank 4, the side surface wall 46 disposed on the lateral side of the wiring 3 curves to dent along the external shape of the wiring 3 with a circular cross section so as to be scooped downward out of the lateral side. Accordingly, in the present embodiment, among the side surface walls of the storage part 43 of the cooling water tank 4, only the side surface wall 46 dents so as to be away from the wiring 3.

The cooling water tank 4 forms a wiring accommodation space S by the dented side surface wall 46 on the lower side of the cover 42 and the lateral side of the storage part 43. The wiring 3 approaches the dented side surface wall 46 of the cooling water tank 4 from the input-output terminal 21 without contact the dented side surface wall 46, passes through the wiring accommodation space S and extends toward the battery. As a result, the cooling water tank 4 is disposed between the electric power control device 2 and the vehicle body internal wall 5 so as to cover from the lateral side of the wiring 3 to at least a portion of the upper side of the wiring 3. That is, as shown in FIG. 1 and FIG. 3, in the plan view of the cooling water tank 4, in a region where the wiring 3 passes through the wiring accommodation space S, the wiring 3 disappears under the cover 42 of the cooling water tank 4. For this reason, the cooling water tank 4 can be configured close to the electric power control device 2 as much as possible. As a result, the separating distance between the electric power control device 2 and the cooling water tank 4 is shortened.

In this way, the cooling water tank 4 has the dented side surface wall 46 along the external shape of the wiring 3, and has a shape covering at least a portion of the wiring 3 which is closely disposed along the dented side surface wall 46, so that the cooling water tank 4 can be arranged in parallel near the electric power control device 2 inside the engine room of the vehicle without being interfered by the wiring 3. In particular, in the present embodiment, only a narrow space exists between the electric power control device 2 and the vehicle body internal wall 5. Even if the wiring 3 is disposed in this space, the cooling water tank is also capable of utilizing the space more effectively and being arranged in parallel near the electric power control device 2. For this reason, the engine room can be miniaturized.

Moreover, by approaching the wiring 3 and covering at least a portion of the wiring 3, the cooling water tank 4 makes temperature of the wiring 3 which increases along with the electric power consumption close to the temperature of the cooling water tank 4 via an air of the wiring accommodation space S cooled by the cooling water of the cooling water tank 4. For this reason, the cooling water tank 4 can suppress the excessive temperature increase of the wiring 3.

Furthermore, when any one or two of the cooling water temperature and the temperature of the cooling water tank 4 is maintained lower than the temperature of the wiring 3 during the running of the vehicle, the cooling water tank 4 can actively suppress the temperature increase of the wiring 3. For example, when the cooling water temperature is maintained at about 60° C., even in a situation in which the temperature of the wiring 3 increases to about 120° C. (heat-resistant temperature) along with the electric power consumption, the temperature of the wiring 3 is suppressed down to about 80° C. As a result, the external diameter of the wiring 3 can be thinner than before, and the engine room can be further miniaturized.

Meanwhile, because the wiring 3 is close to the cooling water tank 4, the swinging wiring 3 may contact to or interfere with the cooling water tank 4 when the vehicle runs. Moreover, due to the attachment deviation in the attachment to the electric power control device 2, there is a deviation in the separating distance between the wiring 3 and the cooling water tank 4; therefore, even when the wiring 3 is kept still, due to the degree of the attachment deviation, the wiring 3 may contact to or interfere with the cooling water tank 4. For this reason, the cooling water tank 4 is separated with an interval below a predetermined interval with consideration of the swinging degree of the wiring 3 and the attachment deviation degree of the wiring 3 with respect to the electric power control device 2. That is, the dented side surface wall 46 of the cooling water tank 4 is formed to a shape separated from the outer periphery of the wiring 3 with an interval below the predetermined interval. The predetermined interval is set to be greater than the swinging distance of the wiring 3 during the running of the vehicle and the distance corresponding to the attachment deviation of the wiring 3 with respect to the electric power control device 2.

Here, the swinging distance of the wiring 3 is a moving distance in the duration when the wiring 3 swings from the resting state and moves in a direction approaching the side surface wall 46 of the cooling water tank 4 when the vehicle runs. Because the dented side surface wall 46 of the cooling water tank 4 shown in this embodiment covers the lateral side of the wiring 3 to the upper side, the swinging distance of the wiring 3 includes both a distance in the Y direction (the width direction of the vehicle) and a distance in the Z direction (the vertical direction of the vehicle) in the drawing. Besides, the distance may also include a distance in the X direction (the front-back direction of the vehicle) in the drawing.

Besides, the distance corresponding to the attachment deviation of the wiring 3 with respect to the electric power control device 2 is a distance from a designed reference place of the wiring 3 in the resting state to a place where the wiring 3 is closest to the cooling water tank 4 due to the attachment deviation. The distance corresponding to the attachment deviation also includes both a distance in the Y direction (the width direction of the vehicle) and a distance in the Z direction (the vertical direction of the vehicle) in the drawing. Besides, the distance may also include a distance in the X direction (the front-back direction of the vehicle) in the drawing.

Figure 8:
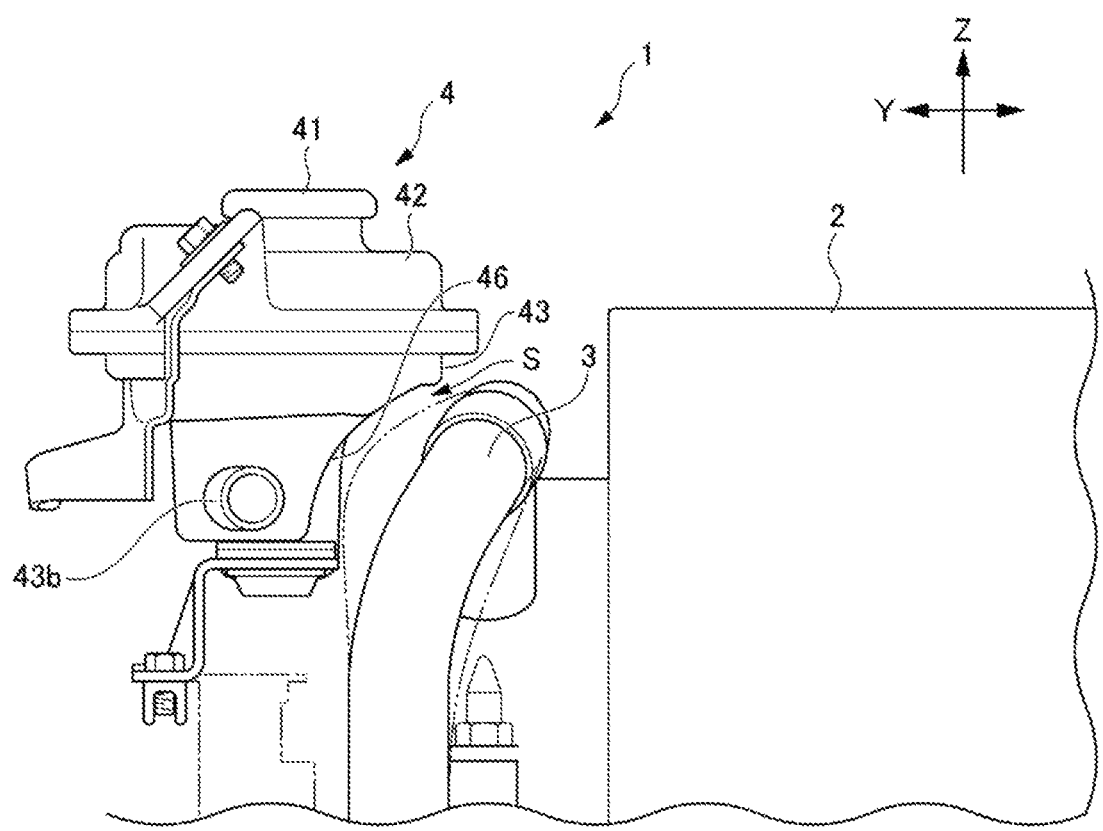
FIG. 8 is a diagram illustrating a relation between the cooling water tank and a swinging wiring, and is a diagram obtained by observing the cooling water tank from the rear side of the vehicle.
Figure 9:
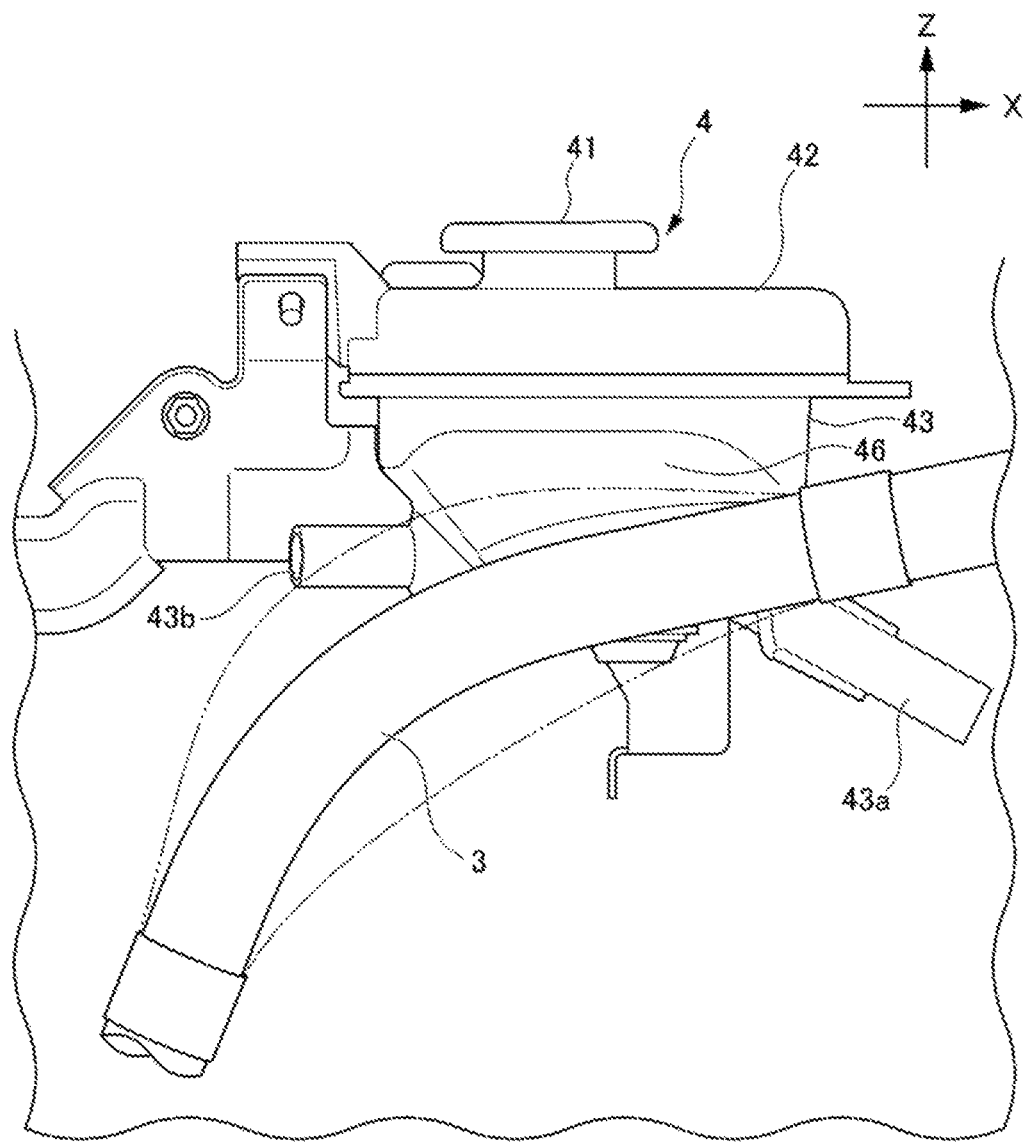
FIG. 9 is a diagram illustrating the relation between the cooling water tank and the cooling water tank and the swinging wiring, and is a diagram obtained by observing the cooling water tank from the electric power control device side.

In this way, the dented side surface wall 46 of the cooling water tank 4 is separated from the wiring 3 within the predetermined interval with consideration of the swinging degree of the wiring 3 and the attachment deviation degree of the wiring 3, so that as shown in FIG. 8 and FIG. 9, the cooling water tank 4 does not contact to or interfere with either the wiring 3 during the resting of the vehicle (represented by a solid line in the drawing), or the swinging wiring 3 during the running of the vehicle (represented by a two-dot chain line in the drawing). For this reason, the abrasion or damage of the wiring 3 and the cooling water tank 4 caused by the contact or the interference can be prevented. Besides, the cooling water tank 4 is disposed so as to overlap in a projected area of the swinging part of the wiring 3, so that the cooling device 1 can be miniaturized.

In particular, when the wiring 3 is a wiring such as a high-voltage wiring for which the diameter is thick, in order to prevent breaking of the wiring, a predetermined length of wiring is bent or the swinging part of the wiring is set. As shown in this embodiment, when the wiring 3 is fixed to the electric power control device 2 by the first bracket 32 (the second fixing part), while the cooling water tank 4 is fixed to the vehicle by the third bracket 44 (the first fixing part) and not directly fixed to the transmission 6, the swinging of the cooling water tank 4 is suppressed, so that the abrasion or damage becomes serious when the swinging wiring 3 contacts to or interferes with the cooling water tank 4. Accordingly, by separating the wiring 3 and the cooling water tank 4 within the predetermined interval as mentioned above, the abrasion or damage of the wiring 3 and the cooling water tank 4 caused by the contact or the interference can be more effectively prevented.

Figure 10:
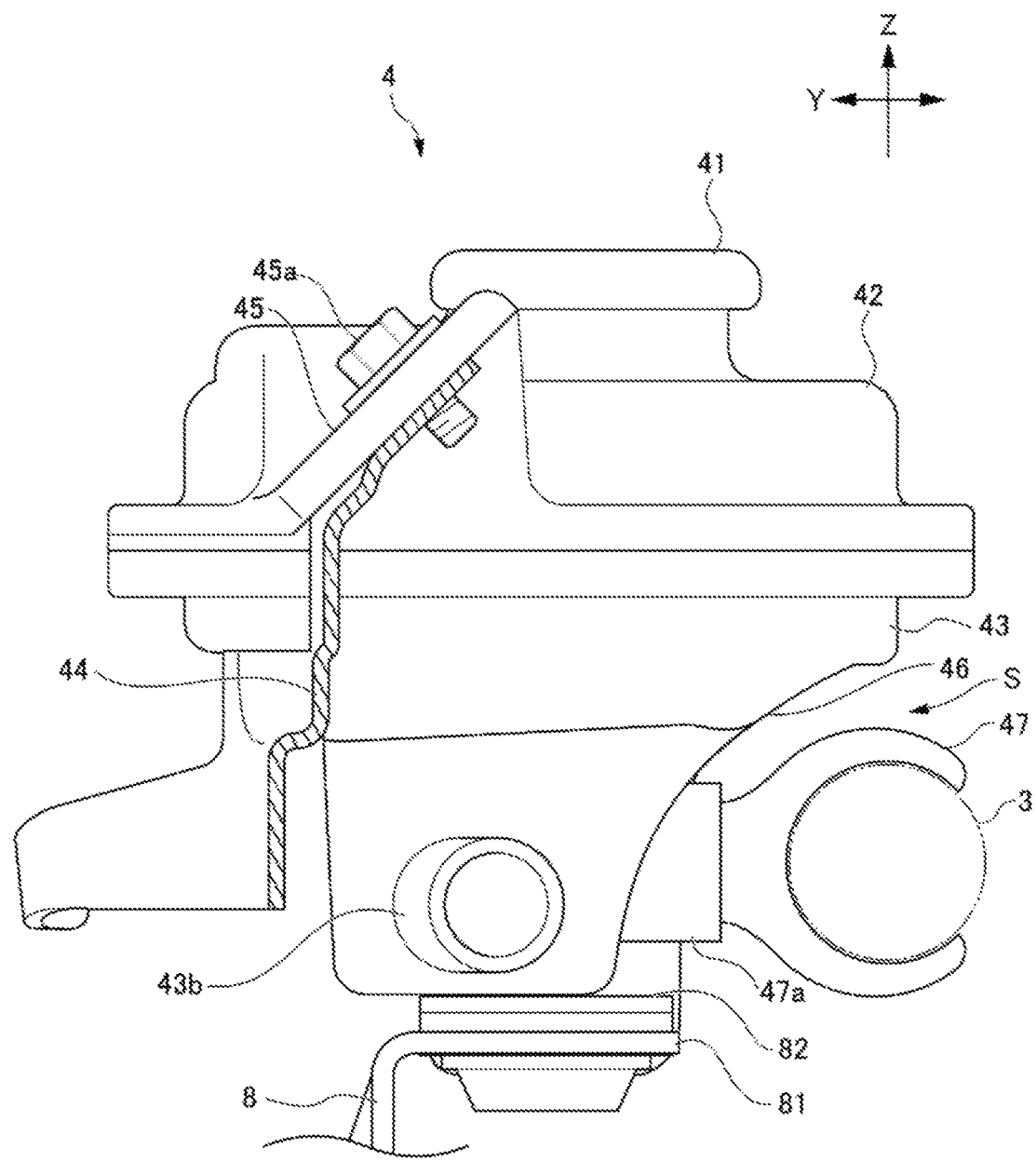
FIG. 10 is a diagram obtained by observing, from the rear side of the vehicle, the cooling water tank which has a third fixing part that fixes the wiring.
Figure 11:
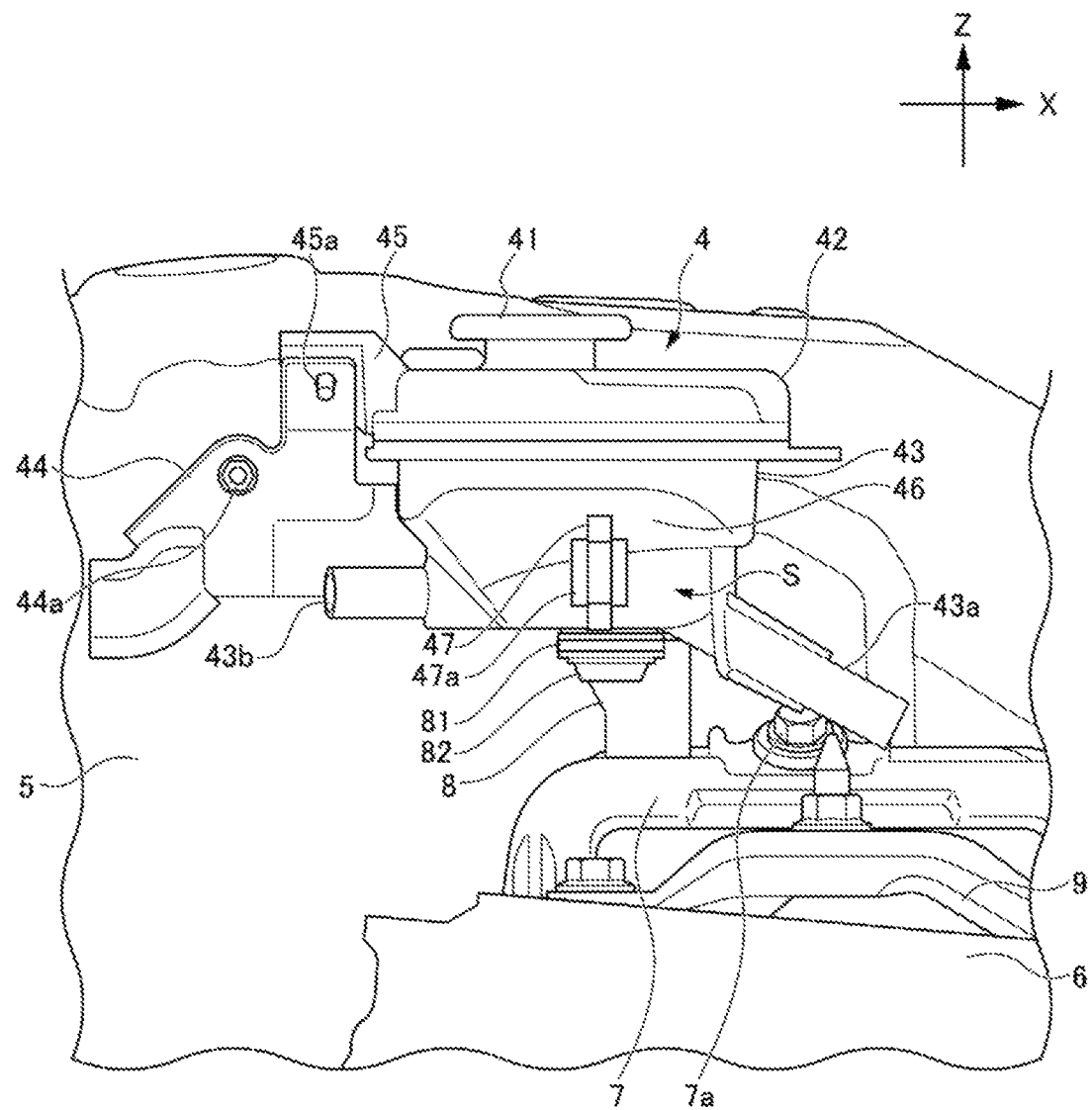
FIG. 11 is a diagram obtained by observing the cooling water tank shown in FIG. 10 from the electric power control device side.
Figure 12:
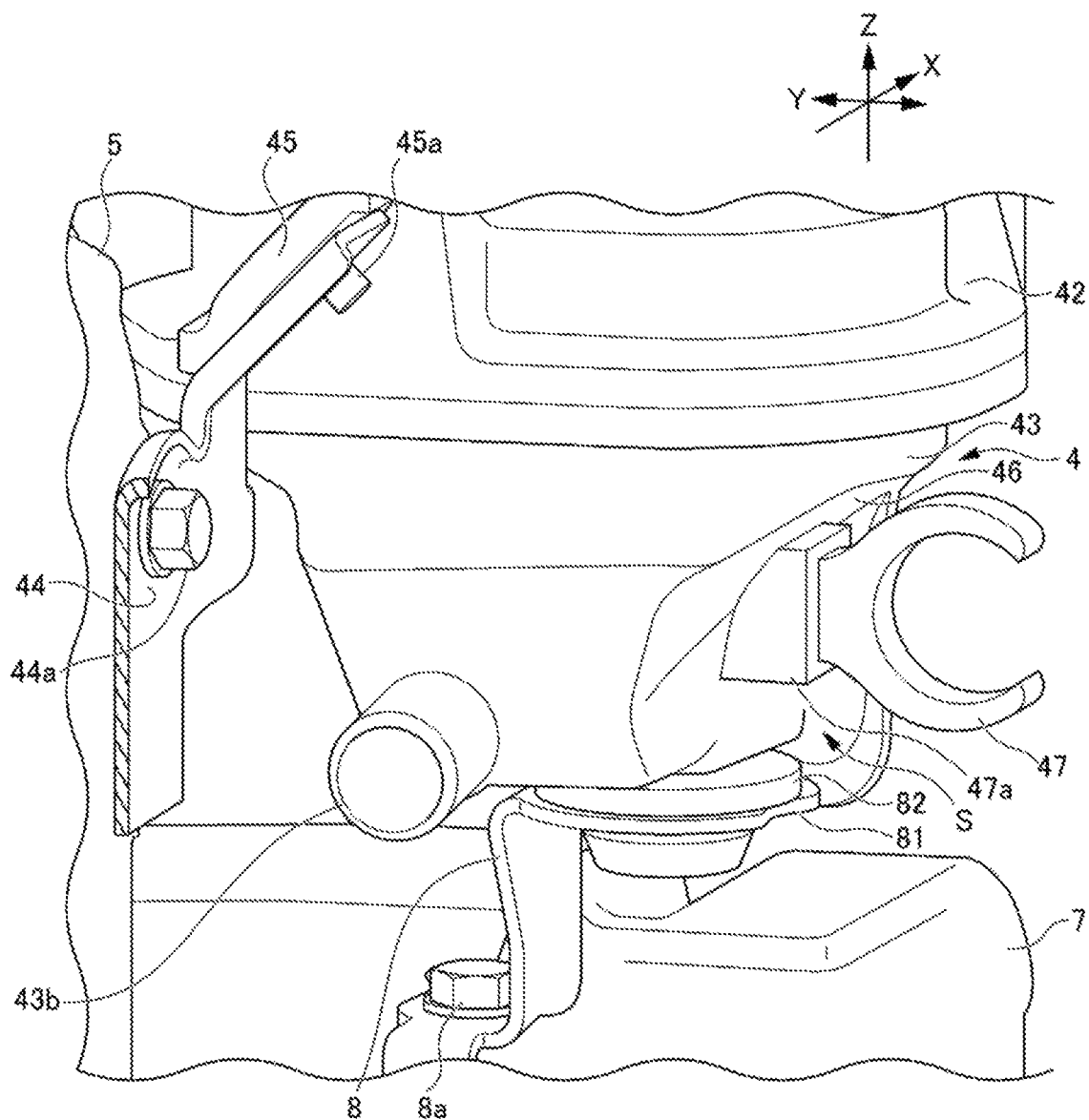
FIG. 12 is a perspective view obtained by observing the cooling water tank shown in FIG. 10 from the rear side of the vehicle.

The wiring 3 may also be fixed to the cooling water tank 4 by a third fixing part. FIG. 10 is a diagram obtained by observing, from the rear side of the vehicle, the cooling water tank 4 which has the third fixing part to fix the wiring 3. FIG. 11 is a diagram obtained by observing the cooling water tank 4 shown in FIG. 10 from the electric power control device side. FIG. 12 is a perspective view obtained by observing the cooling water tank 4 shown in FIG. 10 from the rear side of the vehicle.

In FIG. 10, the wiring 3 is represented by a one-dot chain line.

In FIG. 10 to FIG. 12, the third fixing part includes a C-shaped clip 47 which holds the wiring 3 inside the wiring accommodation space S by elastically gripping the outer periphery of the wiring 3. The clip 47 is a separate structural component from the cooling water tank 4. In the dented side surface wall 46, a base 47*a* for mounting the clip 47 is integrally formed with the dented side surface wall 46. By being fixed to the base 47*a* by an adhesive agent or a setscrew and so on, the clip 47 protrudes from the base 47*a* toward the electric power control device 2 without jutting out of the wiring accommodation space S. Accordingly, the clip 47 fixes the wiring 3 to the cooling water tank 4 by holding the wiring 3 inside the wiring accommodation space S.

In this way, the swinging of the wiring 3 can be suppressed by using the third fixing part (the clip 47) to fix the wiring 3 to the cooling water tank 4. Moreover, in this case, the swinging degree of the wiring 3 becomes low, so that the separating distance between the wiring 3 and the cooling water tank 4 can be further shortened. For this reason, the temperature increase of the wiring 3 can be further suppressed by the cooling water and/or the cooling water tank 4, and the engine room can be further miniaturized.

Figure 13:
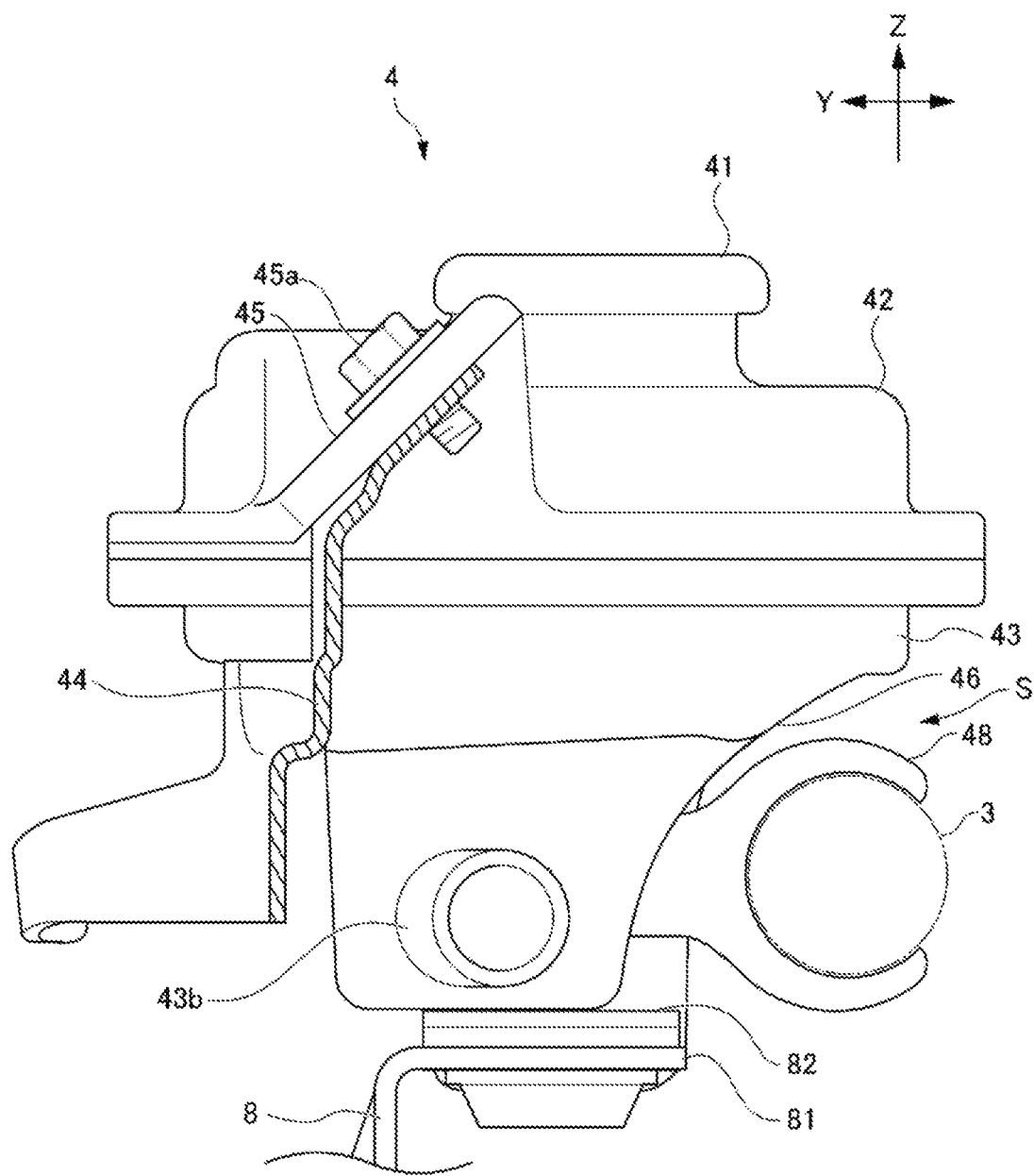
FIG. 13 is a diagram obtained by observing, from the rear side of the vehicle, the cooling water tank for which the third fixing part that fixes the wiring is a portion of the cooling water tank.
Figure 14:
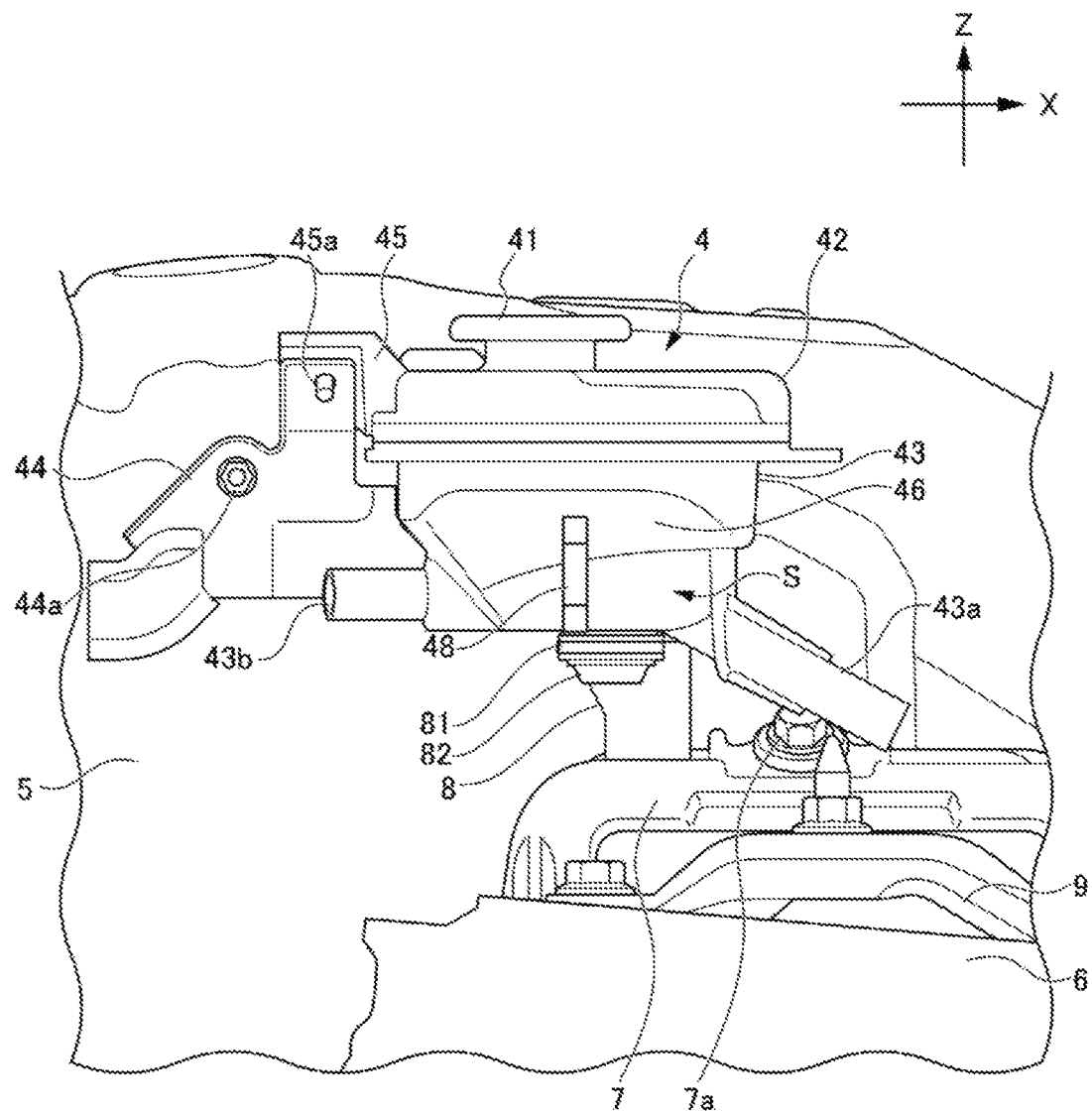
FIG. 14 is a diagram obtained by observing the cooling water tank shown in FIG. 13 from the electric power control device side.
Figure 15:
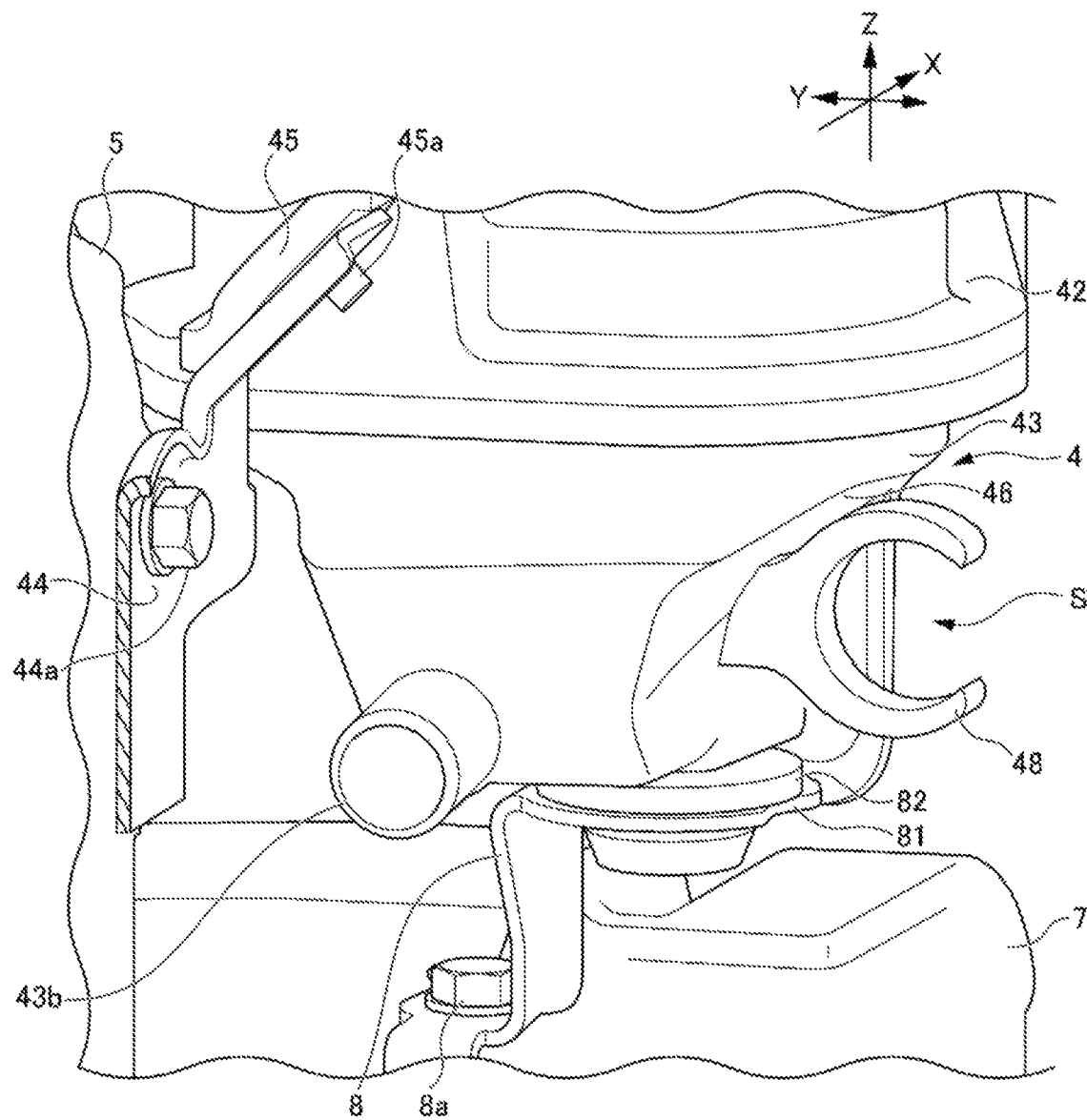
FIG. 15 is a perspective view obtained by observing a cooling water tank shown in FIG. 13 from the rear side of the vehicle.
Figure 16:
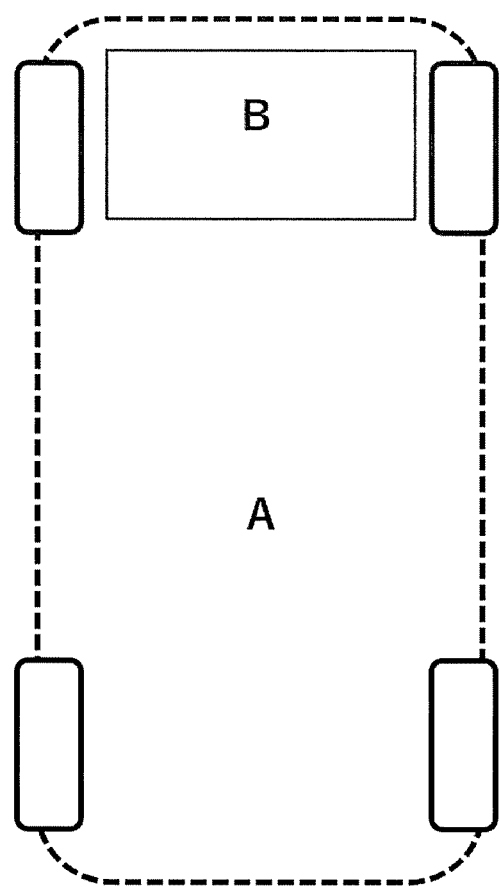
FIG. 16 is a schematic view diagram showing a vehicle (A) and an accommodation chamber (B) according to an embodiment of the disclosure.

The third fixing part may be a portion of the cooling water tank 4. FIG. 13 is a diagram obtained by observing the cooling water tank 4 from the rear side of the vehicle when the third fixing part which fixes the wiring 3 is a portion of the cooling water tank 4. FIG. 14 is a diagram obtained by observing the cooling water tank 4 shown in FIG. 13 from the electric power control device side. FIG. 15 is a perspective view obtained by observing the cooling water tank 4 shown in FIG. 13 from the rear side of the vehicle. In FIG. 13, the wiring 3 is represented by a one-dot chain line.

In FIG. 13 to FIG. 15, the third fixing part includes a C-shaped clip 48 which holds the wiring 3 by elastically gripping the outer periphery of the wiring 3, and is the same as the clip 47 shown in FIG. 10 to FIG. 12 in terms of fixing the wiring 3 to the cooling water tank 4 by holding the wiring 3 in the wiring accommodation space S; the clip 48 is integrally molded with the dented side surface wall 46 of the cooling water tank 4, and forms a portion of the cooling water tank 4. For this reason, the clip 48 integrally protrudes from the dented side surface wall 46 of the cooling water tank 4 toward the electric power control device 2 without jutting out of the wiring accommodation space S.

In this way, by making the third fixing part (the clip 48) a portion of the cooling water tank 4, it is unnecessary to be fixed to the cooling water tank 4 by the adhesive agent or the setscrew and so on as the clip 47 which includes a separate structural component from the cooling water tank 4, so that not only can the structure of the cooling device 1 be further simplified, but the separating distance between the wiring 3 and the cooling water tank 4 can also be shortened compared to the situation in which the third fixing component is separated from the cooling water tank 4. Accordingly, the temperature increase of the wiring 3 can be further suppressed by the cooling water and/or the cooling water tank 4, and the engine room can be further miniaturized.

Meanwhile, the cooling water tank 4 is usually fixed to the vehicle body side in the engine room in more than two positions, so that when the cooling water tank 4 is disposed near the transmission 6, a long fixing component needs to be used. However, when the cooling water tank 4 is fixed to the transmission mount holder 7 which forms the driving speed-change device fixing component by the fourth fixing part (the fourth bracket 8 and the rubber mount 82) in at least one position as in this embodiment, it is unnecessary to use a long fixing component to fix the cooling water tank 4, and the cooling water tank 4 can be fixed in the engine room without enlarging the engine room. For this reason, the space for disposing the cooling water tank 4 is easily ensured, and the engine room can be further miniaturized.

In addition, the fourth fixing part may be a structure which fixes the cooling water tank 4 to the transmission 6 (the driving speed-change device).

In the embodiment described above, the dented side surface wall 46 of the cooling water tank 4 has a shape that covers at least a portion on the upper side of the wiring 3 from the lateral side of the wiring 3, but the invention is not limited hereto. In the embodiments of the invention, the dented side surface wall 46 of the cooling water tank 4 will do as long as it has a shape which covers from the lateral side of the wiring 3 to either or both of the upper side and lower side. Accordingly, though it is not illustrated, the dented side surface wall 46 of the cooling water tank 4 may have a shape which covers the lower side of the wiring 3 from the lateral side of the wiring 3, or may have a shape which covers both the upper side and the lower side of the wiring 3 from the lateral side of the wiring 3.

Besides, the dented side surface wall 46 of the cooling water tank 4 is not limited to a wall which has a shape that completely covers the whole part of the wiring 3 in the width direction from the lateral side of the wiring 3. The dented side surface wall 46 of the cooling water tank 4 will do as long as it has a shape which covers at least a portion of the wiring 3 in the width direction in the plan view of the cooling water tank 4.

Furthermore, in the embodiment described above, the dented side surface wall 46 of the cooling water tank 4 is formed by a dented bending surface, but the invention is not limited hereto. In the embodiments of the invention, the dented side surface wall 46 of the cooling water tank 4 may be formed by, for example, a plurality of plane surfaces which bend along the external shape of the wiring 3.

What is claimed is:

1. A cooling device, which cools a device of a vehicle, wherein the vehicle includes an electric power control device controlling an input-output voltage of the vehicle and wiring which is connected to the electric power control device, the cooling device comprising:
    cooling water, which cools the device of the vehicle; and
    a cooling water tank, which accommodates the cooling water,
    an accommodation chamber for accommodating the electric power control device, the wiring and the cooling water tank, and the accommodation chamber comprises a driving speed-change device of the vehicle, and a driving speed-change device fixing component which fixes the driving speed-change device to a vehicle body which forms a part of the vehicle,
    wherein the cooling water tank has a dented side surface wall along an external shape of the wiring, and the cooling water tank has a shape which covers at least a portion of the wiring by closely disposing the wiring along the dented side surface wall,
    one fixing position of the cooling water tank is fixed to the vehicle body by a first fixing part,
    another fixing position of the cooling water tank is fixed to the vehicle body via the driving speed-change device fixing component.

2. The cooling device according to claim 1, wherein the one fixing position is fixed to a vehicle body inner wall by the first fixing part at an upper part of the cooling water tank,
    the another fixing position is fixed to the vehicle body via the driving speed-change device fixing component at a lower surface of the cooling water tank.

* * * * *